(12) United States Patent
Ji et al.

(10) Patent No.: US 11,372,024 B2
(45) Date of Patent: Jun. 28, 2022

(54) PROBE CARD TEST APPARATUS

(71) Applicant: SAMSUNG ELECTRONICS CO., LTD., Suwon-si (KR)

(72) Inventors: Joonsu Ji, Hwaseong-si (KR); Jinwoo Jung, Hwaseong-si (KR); Taejun Kim, Hwaseong-si (KR); Serim Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 2 days.

(21) Appl. No.: 17/065,135

(22) Filed: Oct. 7, 2020

(65) Prior Publication Data

US 2021/0364551 A1 Nov. 25, 2021

(30) Foreign Application Priority Data

May 20, 2020 (KR) .................. 10-2020-0060279

(51) Int. Cl.
*G01R 31/28* (2006.01)
*G01R 1/073* (2006.01)

(52) U.S. Cl.
CPC ..... *G01R 1/07342* (2013.01); *G01R 31/2889* (2013.01); *G01R 31/2891* (2013.01)

(58) Field of Classification Search
CPC .............. G01R 1/07307; G01R 1/07342
See application file for complete search history.

(56) References Cited

U.S. PATENT DOCUMENTS

| 7,663,382 | B2 | 2/2010 | Corulli et al. |
| 8,400,176 | B2 | 3/2013 | Arkin et al. |
| 8,531,202 | B2 | 9/2013 | Mok et al. |
| 9,541,599 | B2 | 1/2017 | Sato |
| 9,696,402 | B2 | 7/2017 | Kang et al. |
| 2002/0186037 | A1* | 12/2002 | Eldridge ............ G06F 1/26 324/754.07 |
| 2008/0251707 | A1* | 10/2008 | Kathman ........ H01L 27/14687 250/239 |
| 2020/0088827 | A1 | 3/2020 | Ji et al. |

FOREIGN PATENT DOCUMENTS

| JP | 10-339742 A | 12/1998 |
| KR | 10-0929121 B1 | 11/2009 |
| KR | 10-0942064 B1 | 2/2010 |
| KR | 10-1416882 B1 | 7/2014 |
| KR | 10-1887118 B1 | 8/2018 |
| KR | 10-1892646 B1 | 8/2018 |
| KR | 10-1913274 B1 | 10/2018 |

* cited by examiner

*Primary Examiner* — Tung X Nguyen (74) *Attorney, Agent, or Firm* — Lee IP Law, P.C.

(57) ABSTRACT

A probe card test apparatus including an insulating substrate; a conductive pattern on the insulating substrate; and a plurality of device under test (DUT) units on the conductive pattern, wherein each of the DUT units includes a merged-probe opening, a probe opening, and a detector in parallel, and an isolator surrounding the merged-probe opening, the probe opening, and the detector.

20 Claims, 6 Drawing Sheets

PROBE CARD TEST APPARATUS

CROSS-REFERENCE TO THE RELATED APPLICATION

Korean Patent Application No. 10-2020-0060279, filed on May 20, 2020, in the Korean Intellectual Property Office, and entitled: "Probe Card Test Apparatus," is incorporated by reference herein in its entirety.

BACKGROUND

1. Field

Embodiments relate to a probe card test apparatus.

2. Description of the Related Art

Upon execution of a test for mechanical and electrical characteristics of a device under test (DUT) such as a semiconductor wafer, using a probe card, the test may be executed in a state in which probes of the probe card contact electrode pads of the DUT.

SUMMARY

The embodiments may be realized by providing a probe card test apparatus including an insulating substrate; a conductive pattern on the insulating substrate; and a plurality of device under test (DUT) units on the conductive pattern, wherein each of the DUT units includes a merged-probe opening, a probe opening, and a detector in parallel, and an isolator surrounding the merged-probe opening, the probe opening, and the detector.

The embodiments may be realized by providing a probe card test apparatus including an insulating substrate; a conductive pattern on the insulating substrate; and a plurality of device under test (DUT) units on the conductive pattern, wherein each of the DUT units includes a merged-probe opening, a probe opening, an inner detector, and an outer detector in parallel, and an isolator surrounding the inner detector and the merged-probe opening.

The embodiments may be realized by providing a probe card test apparatus including an insulating substrate; a conductive pattern on the insulating substrate; and a plurality of device under test (DUT) units on the conductive pattern, wherein each of the DUT units includes a merged-probe opening, a probe opening, and a detector in parallel, and an isolator surrounding the merged-probe opening and the detector.

BRIEF DESCRIPTION OF THE DRAWINGS

Features will be apparent to those of skill in the art by describing in detail exemplary embodiments with reference to the attached drawings in which.

DETAILED DESCRIPTION

Figure 1A:
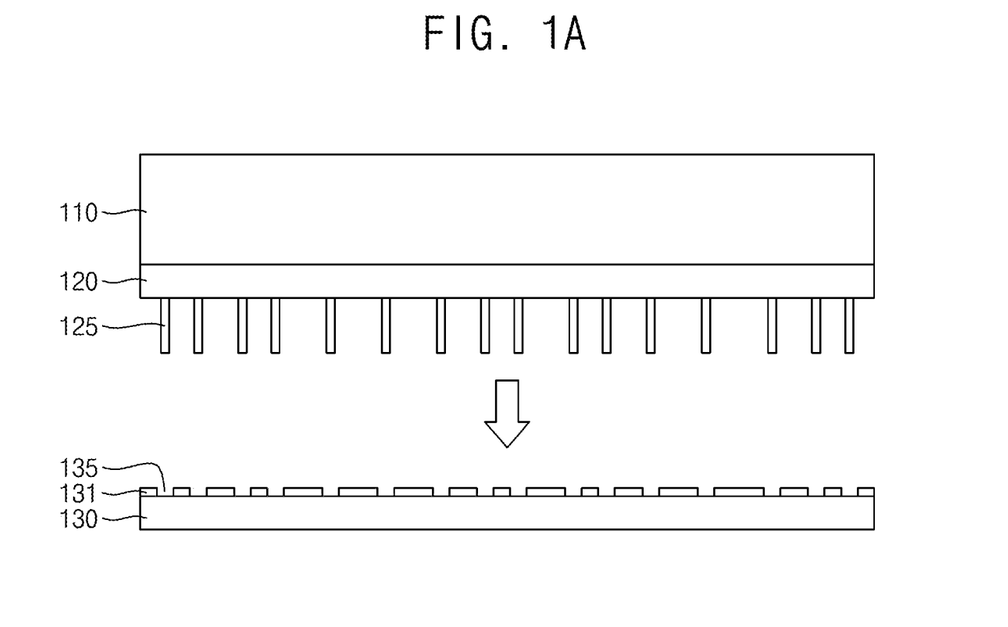
FIGS. 1A and 1B are views of a method for detecting defects of probes of a probe card using probe card test apparatuses according to various exemplary embodiments of the disclosure.
Figure 1B:
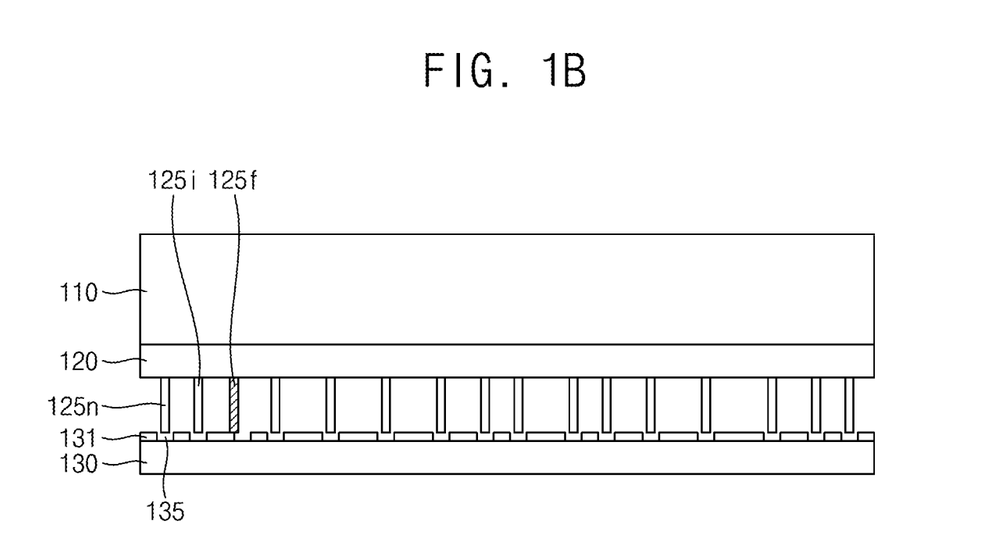
Figure 2:
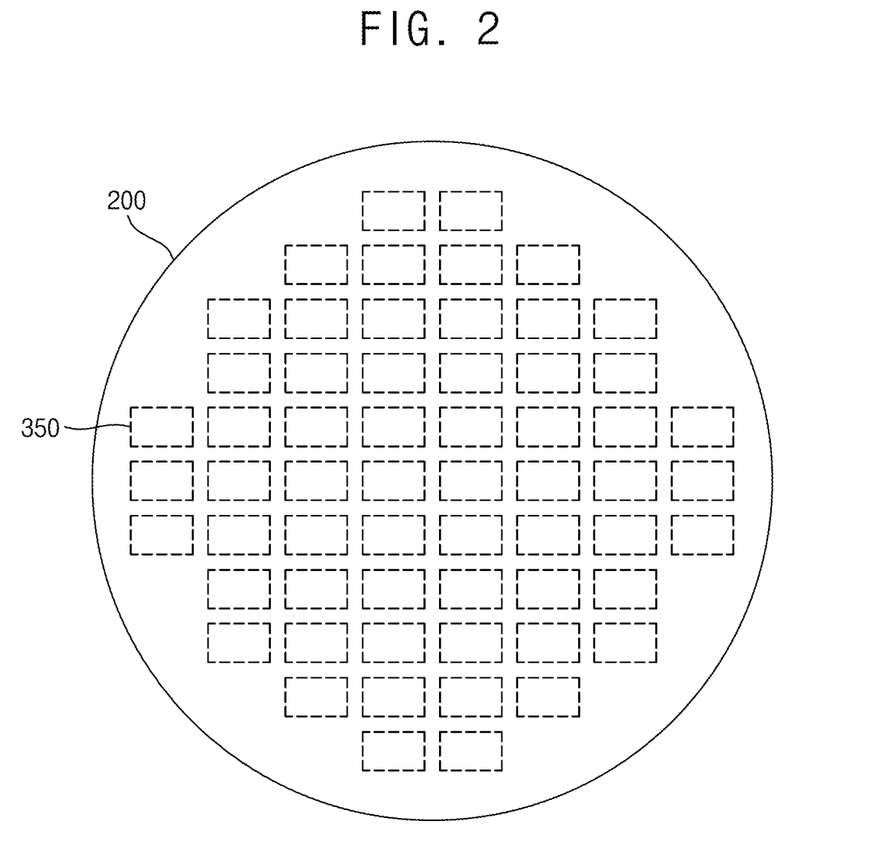
FIG. 2 is a probe card test apparatus according to an exemplary embodiment of the disclosure.
Figure 3:
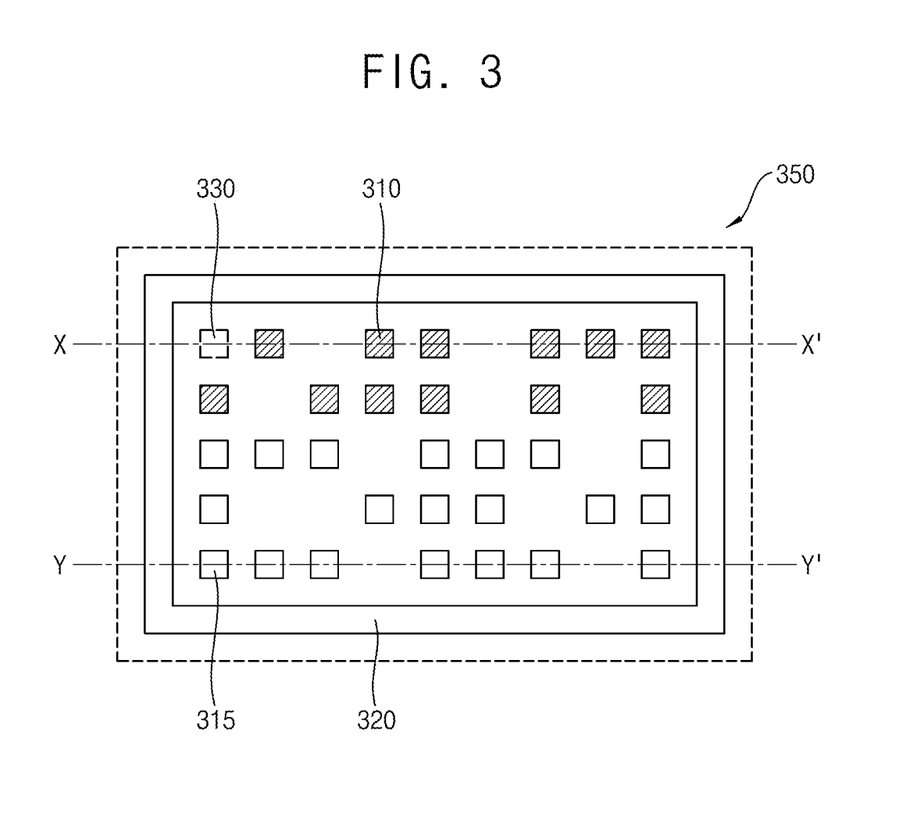
FIG. 3 is a device under test (DUT) unit according to an exemplary embodiment of the disclosure.

FIGS. 1A and 1B are views of a method for detecting defects of probes of a probe card using probe card test apparatuses according to various exemplary embodiments of the disclosure. FIG. 2 is a probe card test apparatus according to an exemplary embodiment of the disclosure. FIG. 3 is a device under test (DUT) unit according to an exemplary embodiment of the disclosure.

Referring to FIGS. 1A, 1B, 2 and 3, a test for detecting defects of the probes 125 in or on the probe card 120 may be performed in accordance with a relative position of the probe card test apparatus 200, which may include an insulating substrate 130 and a conductive pattern 131. The relative position of the probe card test apparatus 200 may be determined in accordance with movement of a wafer chuck supporting a device under test (DUT) or the probe card test apparatus 200.

The probe card test apparatus 200 may include the insulating substrate 130, e.g., made of an insulating material, and the conductive pattern 131, e.g., on the insulating substrate 130 and including a metal layer. The metal layer of the conductive pattern 131 may include openings 135, 310, and 315 etched to have a pad shape, and frame-shaped isolators 320 may each surround a part of the pad-shaped openings 135, 310, and 315. In an implementation, the frame-shape isolators 320 may be formed through etching of the metal layer of the conductive pattern 131. An upper surface of the insulating substrate 130 of the probe card test apparatus 200 may be exposed through the openings 135, 310, and 315, and the isolators 320.

Hereinafter, the operation principle of the probe card test apparatus 200 will be described. First, the pad-shaped openings 135, 310, and 315 may be formed at positions corresponding to the probes 125 of the probe card 120, respectively, and the probe card test apparatus 200 may be brought into contact with the probe card 120. An abnormal probe 125f, which is defective due to, e.g., position misalignment thereof, may deviate from a corresponding one of the openings 135 and, as such, may be brought into contact with the conductive pattern 131. When a detection signal is applied to the conductive pattern 131 through a detector 330, an electrical connection may be established between the abnormal probe 125f and the detector 330 and, as such, the signal may be detected. In an implementation, when only normal probes 125n are present on the probe card 120, all probes may be in an open state and, as such, no signal may be detected from any probe 125. In an implementation, when the abnormal probe 125f is present, a short circuit may be generated and, as such, a signal may be detected.

In a semiconductor test process, the probe card 120 may test semiconductor chips on a wafer several times. For more rapid testing, the number of chips capable of being tested per test may be increased. In an implementation, as the number of DUT units 350 per test increases, the number of probes 125 in the probe card 120 may also be increased. In an implementation, the probe card 120 may merge signals of probes 125 performing the same function for different DUT units 350. In this case, the signal-merged probes 125 of the different DUT units 350 may be referred to as "merged probes".

Probes 125 respectively associated with several DUT units 350 may be signal-merged to constitute a group of merged probes. In this case, when any one of the probes in the merged-probe group is abnormal, all probes of the merged-probe group may be determined or appear to be defective. In an implementation, when the conductive patterns 131 of the DUT units 350 are isolated from one another by the isolators 320, it may be possible to determine which merged probe associated with which one of the DUT units 350 is defective from among the merged probes in the merged-probe group.

Again referring to FIG. 1A, the probe card 120 may include probes 125 to contact DUTs, respectively. The probes 125 may include merged probes configured through merging of a plurality of probes 125, and general probes, e.g., unmerged probes. Circuits of the merged probes may be interconnected and, as such, a merged electrical signal may be applied or detected. The merged probes, which are circuit-connected, may constitute one merged probe group. The probe card 120 may receive test power from a wafer test apparatus 110 to which the probe card 120 is connected. In an implementation, the probe card 120 may be disposed over DUTs in order to test the DUTs.

In an implementation, for test of the probe card 120 itself, the probe card 120 may be disposed over the probe card test apparatus including the insulating substrate 130 and the conductive pattern 131. The probes 125, which contact the probe card test apparatus, may be electrically connected to the conductive pattern 131 included in the probe card test apparatus.

Upon a test of the DUTs, the probes 125 of the probe card 120 may contact pads of the DUTs, respectively. If positions of the probes 125 were to incorrectly correspond to respective pad positions of the DUTs, it may be impossible to correctly perform defect detection for the DUTs through the probe card 120. In an implementation, whether positions of the probes 125 correctly correspond to respective pad positions of the DUTs may be tested.

Referring to FIG. 1B, the probe card 120 may contact the probe card test apparatus. In an implementation, a lower end of a probe 125 of the probe card 120 may physically contact the conductive pattern 131 of the probe card test apparatus. The probe card test apparatus may include the conductive pattern 131, which may include metal such as copper (Cu), and a plurality of openings 135 in the conductive pattern 131. The plurality of openings 135 may be formed in areas or positions where pads of target DUTs will be disposed, respectively. In an implementation, formation positions of the plurality of openings may be varied in accordance with a design state of the target DUT.

When probes 125 of the probe card 120 are positioned at normal positions thereof, respectively, such probes, e.g., normal probes 125n, may be aligned with a plurality of openings 135 present between adjacent portions of the conductive pattern 131. The openings 135 present between adjacent portions of the conductive pattern 131 may expose the upper surface of the insulating substrate 130 in the probe card test apparatus. The normal probes 125n may connect or contact the insulating substrate 130 of the probe card test apparatus or may be floated in the openings 135, respectively. Accordingly, each normal probe 125n may be in an electrically open state and, as such, no signal may flow between the normal probe 125n and another normal probe 125n or between the normal probe 125n and a detection probe 125i, which will be described in greater detail below.

In an implementation, if a probe 125 is not positioned at a normal position, such a probe, e.g., an abnormal probe 125f, may be aligned with or on the conductive pattern 131 and, as such, may physically contact the conductive pattern 131. Accordingly, the abnormal probe 125f may be electrically connected to the detection probe 125i physically contacting the detector, which is electrically connected to the conductive pattern 131 and, as such, may be in a short-circuited or closed circuit state. As a result, a signal may flow between the abnormal probe 125f and the detection probe 125i. In an implementation, when a signal from the detection probe 125i is received, this state is a short-circuited state. In this case, through application of a relay signal, the position of the abnormal probe 125f may be detected.

Referring to FIG. 2, the probe card test apparatus 200 may include an insulating substrate and a conductive pattern on the insulating substrate, and may further include a plurality of DUT units 350 on the conductive pattern. The number of the DUT units 350 may be equal to the number of unit DUTs measurable per test by the probe card from among target DUTs of the probe card.

Referring to FIG. 3, in an embodiment, the DUT unit 350 may include merged-probe openings 310, probe openings 315, and a detector 330, which may be disposed in parallel in the same plane, and an isolator 320 surrounding the merged-probe openings 310, the probe openings 315, and the detector 330.

The isolator 320 may electrically separate the merged-probe openings 310, the probe openings 315, and the detector 330 in one DUT unit 350 from the merged-probe openings 310, the probe openings 315, and the detector 330 in another DUT unit 350. An upper surface of the insulating substrate 130 in the probe card test apparatus 200 may be exposed through the isolator 320. In an implementation, a direct current (DC) signal in the isolator 320 may not be transmitted to another DUT unit 350 outside the isolator 320.

The merged-probe openings 310, the probe openings 315, and the detector 330 may be formed in areas where pads of DUTs in or to be tested by the probe card will be disposed, respectively. A portion of the insulating substrate 130 may be exposed through the merged-probe openings 310. In an implementation, the DUT unit 350 may further include a first insulating pattern filling the merged-probe openings 310.

Positions of the probe openings 315 may correspond to areas where unmerged probes of the probe card will be positioned, respectively. A portion of the insulating substrate 130 may be exposed through the probe openings 315. In an implementation, the DUT unit 350 may further include a second insulating pattern filling the probe openings 315. In an implementation, the probes positioned at the merged-probe openings 310 and the probe openings 315 may be insulated and, as such, no signal may flow therethrough.

Positions of the merged-probe openings 310 may correspond, one by one, to a position of a plurality of merged probes in the probe card. In an implementation, one probe may correspond to one merged-probe opening 310. In order to separate merged signals of a merged probe group from one another, the merged probes respectively corresponding to the plurality of merged-probe openings 310 included in one DUT unit 350 may have separate merged-probe groups, respectively. In an implementation, the merged probes respectively corresponding to the plurality of merged-probe openings 310 included in one DUT unit 350 while being circuit-isolated from one another through the isolator 320 may apply or receive separate signals, respectively.

A position of the detector 330 may correspond to areas in which the detection probe of the probe card will be positioned. The detector 330 may detect a signal according to whether contact of a probe 125 occurs. A signal may be continuously applied through the detector 330. When an abnormal probe 125f is present, the detector 330 and the abnormal probe 125f may be electrically connected through the conductive pattern 131 and, as such, a signal applied through the detector 330 may be detected. The detection probe from among the probes 125 of the probe card 120 may always be in contact with the detector 330. In an implementation, a plurality of detection probes may contact the single detector 330. In an implementation, the detector 330 may correspond to a plurality of detection probes.

Referring to FIG. 3, all openings 310 and 315 and the detector 330 in the single DUT unit 350 may be connected by a continuous conductive pattern. In an implementation, the detector 330 may detect defects of merged probes in the probe card through a direct current (DC) signal, and may detect defects of unmerged probes in the probe card through a DC signal.

Figure 4A:
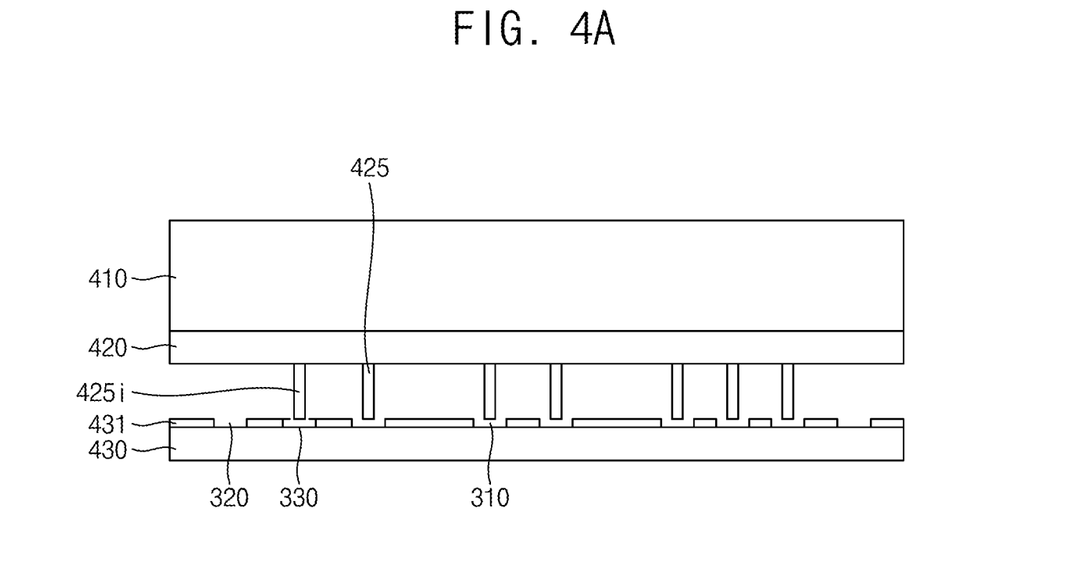
FIGS. 4A to 4D are views of a method for detecting defects of probes in a probe card using probe card test apparatuses according to various exemplary embodiments of the disclosure.
Figure 4B:
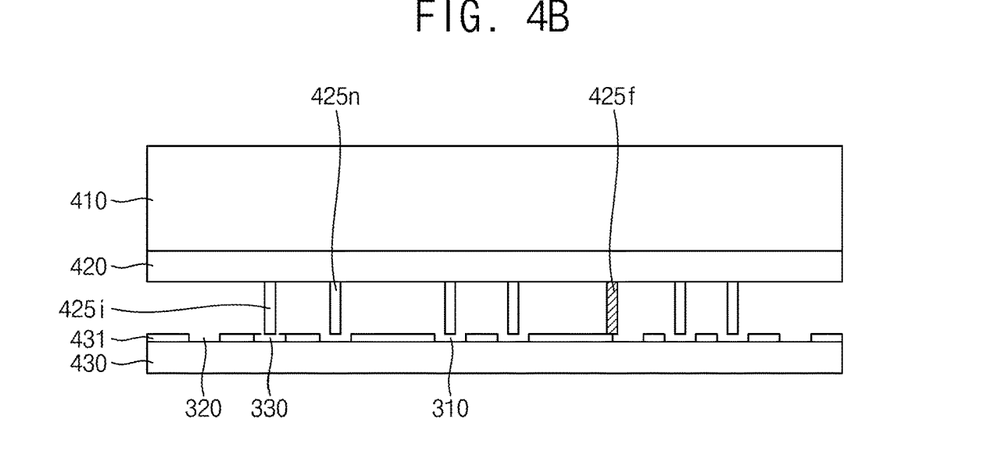
Figure 4C:
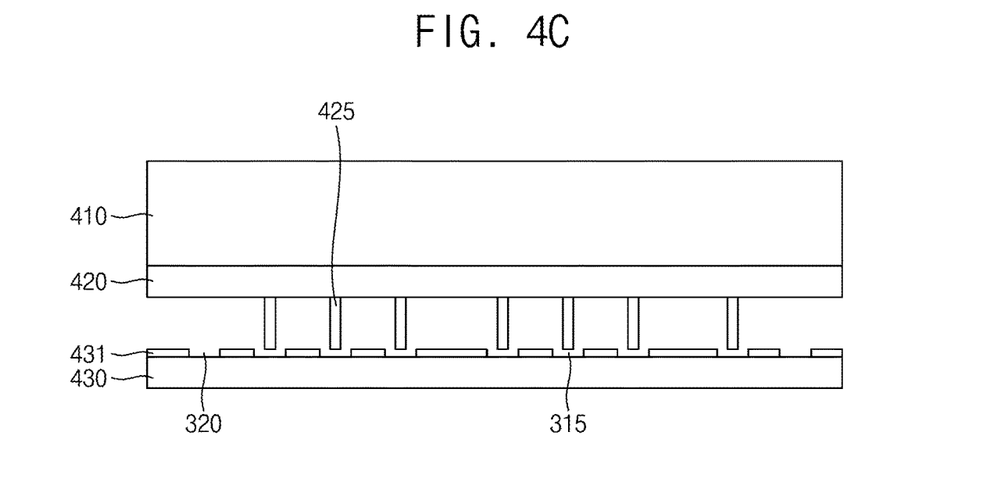
Figure 4D:
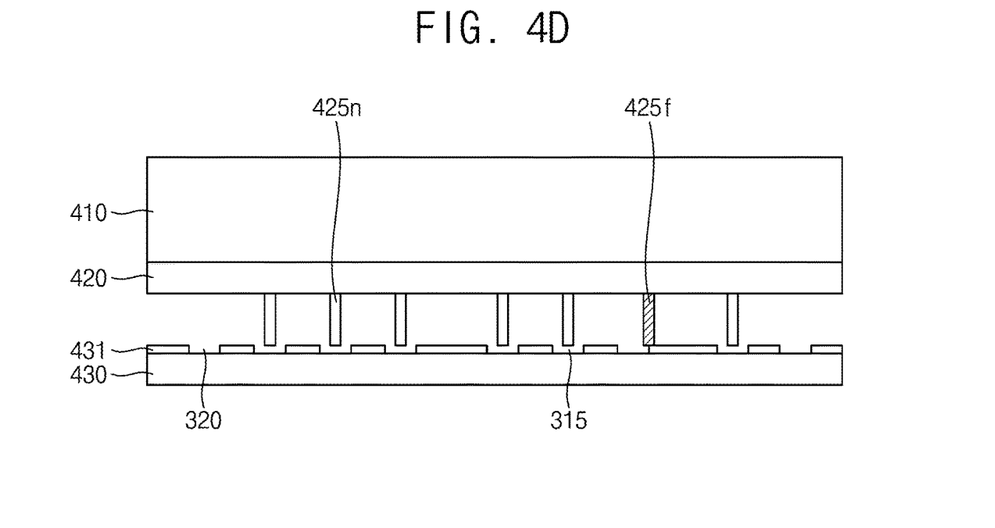

FIGS. 4A to 4D are views of a method for detecting defects of probes in a probe card using probe card test apparatuses according to various exemplary embodiments of the disclosure. FIGS. 4A and 4B are views showing a cross-section taken along line X-X' in FIG. 3. FIGS. 4C and 4D are views showing a cross-section taken along line Y-Y' in FIG. 3.

Referring to FIG. 4A, a probe card 420 may be connected to a wafer test apparatus 410 and, as such, may be tested by a probe card test apparatus including an insulating substrate 430, a conductive pattern 431, and merged-probe openings 310. Probes 425 of the probe card 420 may correspond to respective openings (e.g., merged-probe openings 310) of the probe card test apparatus such that the probes 425 may be insulated. A detection probe 425i of the probe card 420 may be brought into contact with a detector of the probe card test apparatus, and may be electrically connected to the conductive pattern 431.

Referring to FIG. 4B, the probe card 420 may include a detection probe 425i, a normal probe 425n, and an abnormal probe 425f. The normal probe 425n is a probe having no defect, and may be over or aligned with one opening (e.g., merged-probe opening 310) of the probe card test apparatus. The abnormal probe 425f is a probe having a contact defect, and may be horizontally misaligned with respect to the opening thereunder and, as such, may contact the conductive pattern 431. The detection probe 425i may contact the detector 330 electrically connected to the conductive pattern 431. When a signal is applied in a relay manner to the probes 425n and 425f, it may be possible to detect an area through which a signal flows due to electrical connection caused by a defect or short circuit and, as such, the abnormal probe 425f may be detected.

Referring to FIG. 4C, the probe card 420 may be connected to a wafer test apparatus 410 and, as such, may be tested by a probe card test apparatus including an insulating substrate 430, a conductive pattern 431, and probe openings 315. Probes 425 of the probe card 420 may correspond to respective probe openings 315 of the probe card test apparatus such that the probes 425 may be insulated.

Referring to FIG. 4D, the probe card 420 may include a detection probe 425i, a normal probe 425n, and an abnormal probe 425f. The normal probe 425n may be a probe having no defect, and may be over or aligned with one probe opening 315 of the probe card test apparatus. The abnormal probe 425f may be a probe having a contact defect, and may be horizontally misaligned from the probe opening 315 disposed thereunder and, as such, may contact the conductive pattern 431. Again referring to FIGS. 3, 4A and 4B, the detection probe 425i may contact a detector 330 electrically connected to the conductive pattern 431 of FIG. 4D. When a signal is applied in a relay manner to the probes 425n and 425f, it may be possible to detect an area through which a signal flows due to electrical connection caused by a defect or short circuit and, as such, the abnormal probe 425f may be detected.

Figure 5A:
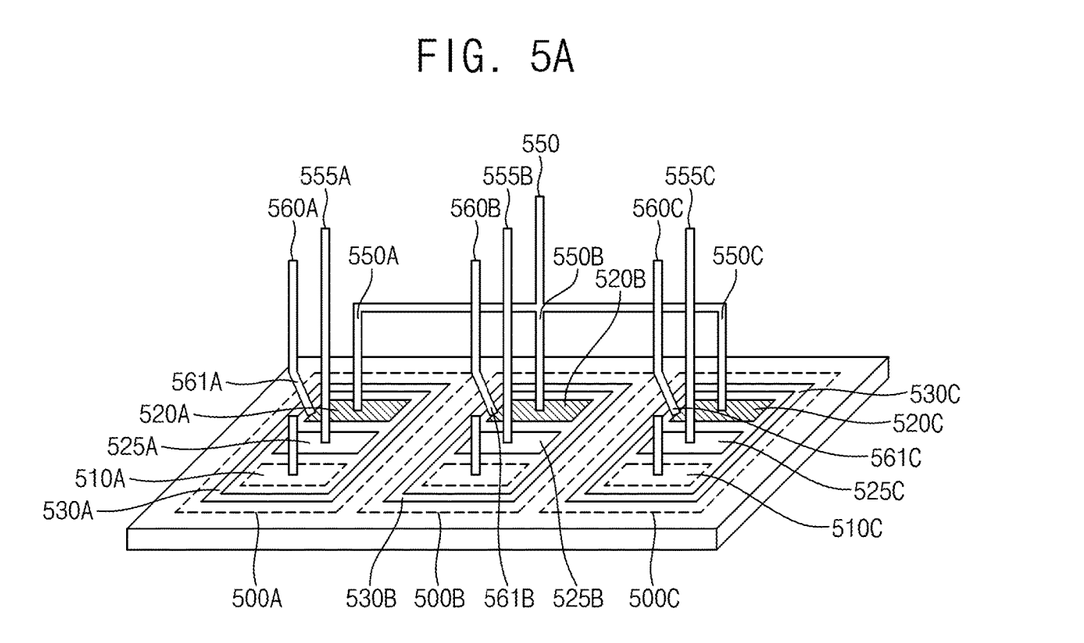
FIGS. 5A and 5B are probe card test apparatuses according to various exemplary embodiments of the disclosure.
Figure 5B:
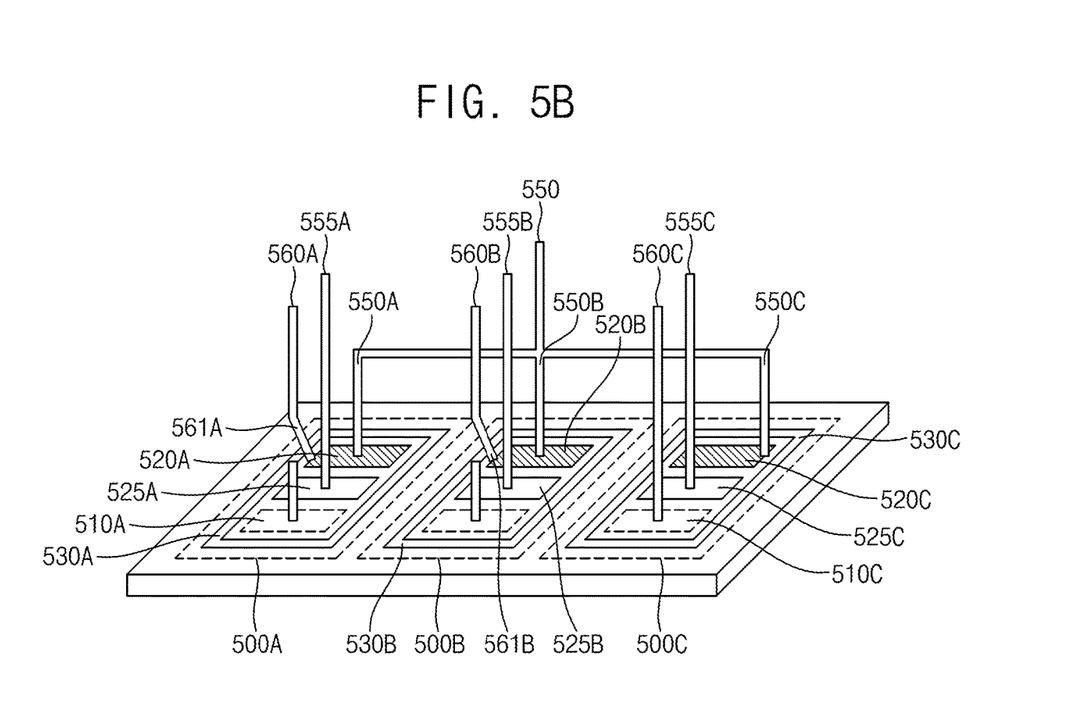

FIGS. 5A and 5B are probe card test apparatuses according to various exemplary embodiments of the disclosure. FIGS. 5A and 5B illustrate an embodiment in which each DUT unit 500A, 500B or 500C includes one detector 510A, 510B or 510C, one merged-probe opening 520A, 520B or 520C, one probe opening 525A, 525B or 525C, and an isolator 530A, 530B or 530C surrounding these elements.

Referring to FIG. 5A, it may be seen that merged-probe wirings 550A, 550B and 550C respectively connected to merged probes corresponding to respective merged-probe openings 520A, 520B and 520C of the DUT units 500A, 500B and 500C are electrically connected. On the other hand, probe wirings 555A, 555B and 555C respectively connected to probes corresponding to respective probe openings 525A, 525B and 525C of the DUT units 500A, 500B and 500C are not electrically connected and, as such, signals of the probes may be separately detected without being merged.

When the probe card includes merged probes, detection wirings 560A, 560B and 560C connected to respective detectors 510A, 510B and 510C of the DUT units 500A, 500B and 500C insulated from one another by respective isolators 530A, 530B and 530C may include wiring switches 561A, 561B and 561C, respectively. In the case in which the wiring switches 561A, 561B and 561C operate sequentially without overlapping with one another, even when a signal is detected through the merged-probe wirings 550 due to a short circuit or defect of the merged-probes, it may be possible to determine which merged probe is defective from among the merged probes of the DUT units 500A, 500B and 500C by determining which wiring switch is in a closed state from among the wiring switches 561A, 561B and 561C when the signal is detected.

Referring to FIG. 5B, in an embodiment, the third DUT unit 500C may include an abnormal merged probe. In this case, a short circuit caused by the abnormal merged probe of the third DUT unit 500C may not occur when the first wiring switch 561A and the second wiring switch 561B are closed, by virtue of the isolators 530A, 530B and 530C respectively insulating the DUT units 500A, 500B and 500C. In an implementation, only when the third wiring switch 561C is closed, is a signal detected by the detector 510C. Accordingly, it may be possible to determine which merged probe is defective from among the merged probes of the DUT units.

Figure 6:
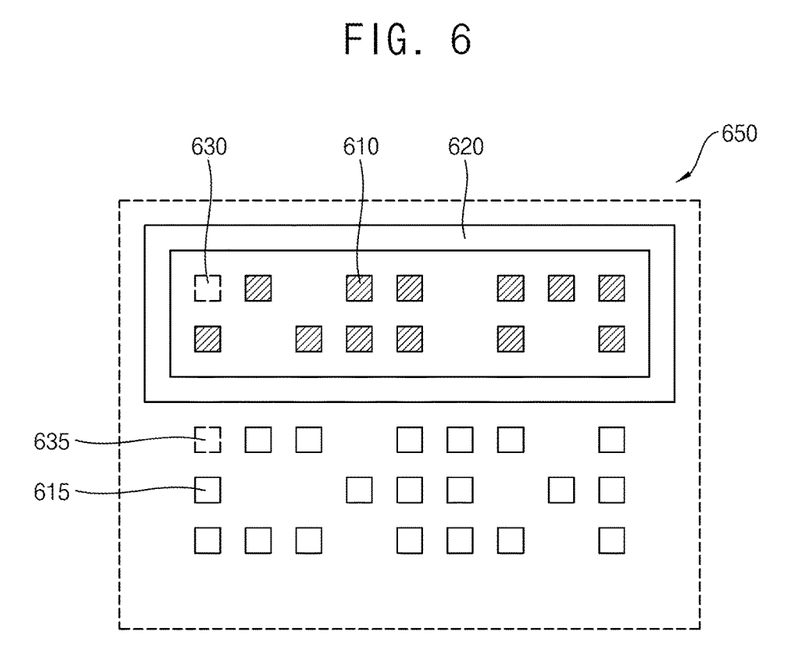
FIG. 6 is a DUT unit according to an exemplary embodiment of the disclosure.

FIG. 6 is a DUT unit according to an exemplary embodiment of the disclosure. Referring to FIG. 6, the DUT unit 650 may include merged-probe openings 610, probe openings 615, an inner detector 630, and an outer detector 635, which are in parallel in the same plane, and an isolator 620 surrounding the merged-probe openings 610 and the inner detector 630.

The isolator 620 may electrically separate the merged-probe openings 610 and the inner detector 630 in the DUT unit 650 from the probe openings 615, the outer detector 635 in the DUT unit 650 and, e.g., the merged-probe openings 610 in another DUT unit 650. An upper surface of the insulating substrate 130 in the probe card test apparatus 200 may be exposed through the isolator 620. In an implementation, a direct current (DC) signal in the isolator 620 may not be transmitted to the conductive pattern outside the isolator 620 or the other DUT unit 650.

Referring to FIG. 6, the merged-probe openings 610 and the inner detector 630 included inside the isolator 620 of the single DUT unit 650 may be connected by a continuous conductive pattern, and the probe openings 615 and the outer detector 635 outside the isolator 620 may be connected by another continuous conductive pattern. Accordingly, in the embodiment, the inner detector 630 may detect defects of merged probes in the probe card through a DC signal, and the outer detector 635 may also detect defects of unmerged probes in the probe card through a DC signal.

Figure 7:
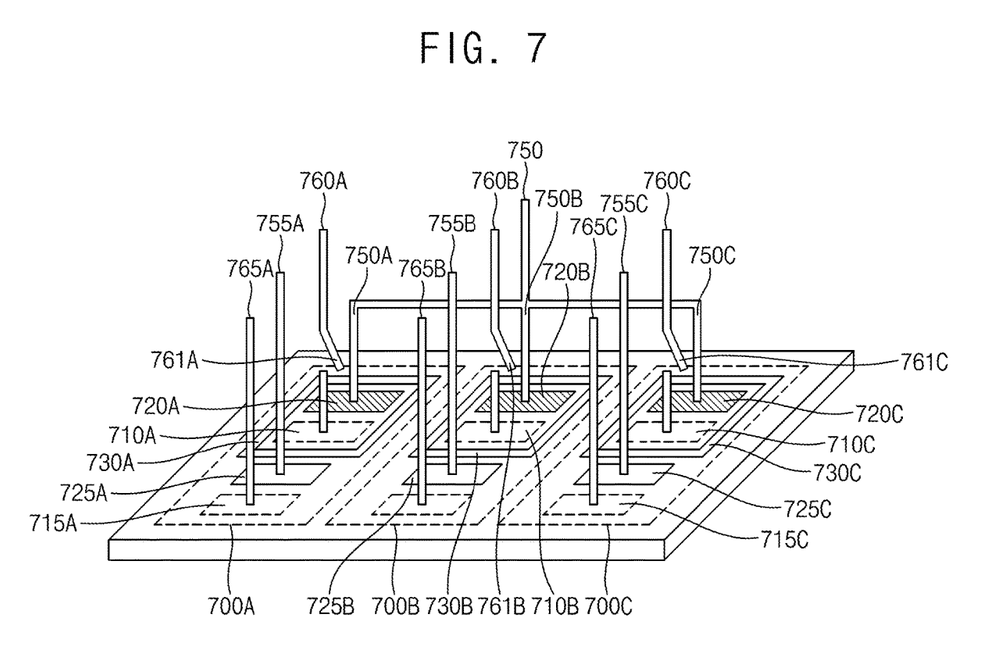
FIG. 7 is a probe card test apparatus according to an exemplary embodiment of the disclosure.

FIG. 7 is a probe card test apparatus according to an exemplary embodiment of the disclosure. FIG. 7 schematically illustrates an embodiment in which each DUT unit 700A, 700B or 700C includes one inner detector 710A, 710B or 710C, one outer detector 715A, 715B or 715C, one merged-probe opening 720A, 720B or 720C, one probe opening 725A, 725B or 725C, and an isolator 730A, 730B or 730C surrounding the inner detector 710A, 710B or 710C and the merged-probe opening 720A, 720B or 720C.

Referring to FIG. 7, it can be seen that merged-probe wirings 750A, 750B and 750C respectively connected to merged probes corresponding to respective merged-probe openings 720A, 720B and 720C of the DUT units 700A, 700B and 700C may be electrically connected. In an implementation, probe wirings 755A, 755B and 755C respectively connected to probes corresponding to respective probe openings 725A, 725B and 725C of the DUT units 700A, 700B and 700C may not be electrically connected and, as such, signals of the probes may be separately detected without being merged.

When the probe card includes merged probes, detection wirings 760A, 760B and 760C connected to respective inner detectors 710A, 710B and 710C within areas insulated from one another by the isolators 730A, 730B and 730C may include wiring switches 761A, 761B and 761C, respectively. In the case in which the wiring switches 761A, 761B and 761C operate sequentially without overlapping with one another, even when a signal is detected through the merged-probe wirings 750 due to a defect or short circuit of the merged-probes, it may be possible to determine which merged probe is defective from among the merged probes of the DUT units 700A, 700B and 700C by determining which wiring switch is in a closed state from among the wiring switches 761A, 761B and 761C when the signal is detected.

In an implementation, referring to FIGS. 6 and 7, the outer detectors 635, 715A, 715B and 715C may be omitted. In an implementation, the DUT unit 650 may include merged-probe openings 610, probe openings 615, and an inner detector 630, which are in parallel in the same plane, and an isolator 620 surrounding the merged-probe openings 610 and the inner detector 630.

The isolator 620 may electrically separate the merged-probe openings 610 and the inner detector 630 in the DUT unit 650 from the probe openings 615 in the DUT unit 650 and, e.g., the merged-probe openings 610 in another DUT unit 650. An upper surface of the insulating substrate 130 of the probe card test apparatus 200 may be exposed through the isolator 620. In an implementation, a direct current (DC) signal in the isolator 620 may not be transmitted to the conductive pattern outside the isolator 620 or the other DUT unit 650.

In an implementation, the merged-probe openings 610 and the inner detector 630 included inside the isolator 620 of the single DUT unit 650 may be connected by a continuous conductive pattern, and the probe openings 615 outside the isolator 620 may be connected by another continuous conductive pattern. In an implementation, the inner detector 630 may detect defects of merged probes in the probe card through a DC signal. In an embodiment in which the outer detector 635 is omitted, unmerged probes of the probe card cannot be connected in series to the inner detector 630. In an implementation, the inner detector 630 may detect defects of unmerged probes of the probe card through an alternating current (AC) signal.

By way of summation and review, a probe card may have manufacturing defects. Different defects may be generated even in probe cards having the same specifications. Prior to a test for a DUT using a probe card, a defect test on the probe card itself may be performed. A part of or some probes in the probe card may be in a merged state. When a defect is detected in association with merged probes, which probe has generated the defect from among the merged probes may be determined.

In an embodiment, it may be possible to test connection errors of merged probes or unmerged probes in the probe card or operation errors of the probe card. In addition, it may be possible to prevent semiconductor chips in DUTs from being sorted into defective chips due to errors of the probe card by testing whether or not the probe card itself is defective, before practically testing a DUT wafer.

One or more embodiments may provide a probe card test apparatus including a detector for detecting a defect of a merged probe.

One or more embodiments may provide a wafer test apparatus for a probe card test capable of rapidly, accurately, and systematically performing a defect test for a probe card through separation of signals of merged probes.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A probe card test apparatus, comprising:
an insulating substrate;
a conductive pattern on the insulating substrate; and
a plurality of device under test (DUT) units on the conductive pattern,
wherein each of the DUT units includes a merged-probe opening, a probe opening, and a detector in parallel, and an isolator groove surrounding the merged-probe opening, the probe opening, and the detector.

2. The probe card test apparatus as claimed in claim 1, wherein:
a position of the merged-probe opening corresponds to a position of a merged probe of a probe card;

a position of the probe opening corresponds to a position of a probe of the probe card; and a position of the detector corresponds to a position of a detection probe of the probe card.

3. The probe card test apparatus as claimed in claim 2, wherein the merged-probe openings of the DUT units correspond, one by one, to a plurality of merged probes of the probe card.

4. The probe card test apparatus as claimed in claim 3, wherein the plurality of merged probes have separate merged-probe groups, respectively.

5. The probe card test apparatus as claimed in claim 2, wherein the detector corresponds to a plurality of detection probes of the probe card.

6. The probe card test apparatus as claimed in claim 1, wherein:

the detector detects a merged-probe defect of a probe card through a direct current (DC) signal; and the detector detects a probe defect of the probe card through a DC signal.

7. The probe card test apparatus as claimed in claim 1, wherein:

one portion of the insulating substrate is exposed through the merged-probe opening; and another portion of the insulating substrate is exposed through the probe opening.

8. The probe test apparatus as claimed in claim 1, further comprising insulating patterns filling the merged-probe opening and the probe opening, respectively.

9. A probe card test apparatus, comprising:

an insulating substrate;

a conductive pattern on the insulating substrate; and a plurality of device under test (DUT) units on the conductive pattern, wherein each of the DUT units includes a merged-probe opening, a probe opening, an inner detector, and an outer detector in parallel, and an isolator surrounding the inner detector and the merged-probe opening.

10. The probe card test apparatus as claimed in claim 9, wherein:

a position of the merged-probe opening corresponds to a position of a merged probe of a probe card;

a position of the probe opening corresponds to a position of a probe of the probe card; and positions of the inner detector and the outer detector respectively correspond to positions of detection probes of the probe card.

11. The probe card test apparatus as claimed in claim 10, wherein the merged-probe openings of the DUT units correspond, one by one, to a plurality of merged probes of the probe card.

12. The probe card test apparatus as claimed in claim 11, wherein the plurality of merged probes have separate merged-probe groups, respectively.

13. The probe card test apparatus as claimed in claim 9, wherein:

the inner detector detects a merged-probe defect of a probe card through a direct current (DC) signal; and the outer detector detects a probe defect of the probe card through a DC signal.

14. The probe card test apparatus as claimed in claim 9, wherein:

one portion of the insulating substrate is exposed through the merged-probe opening; and another portion of the insulating substrate is exposed through the probe opening.

15. The probe test apparatus as claimed in claim 9, further comprising insulating patterns filling the merged-probe opening and the probe opening, respectively.

16. The probe test apparatus as claimed in claim 9, wherein:

each of the DUT units includes a plurality of inner detectors and a plurality of merged-probe openings; and the isolator includes:

a first isolator surrounding a part of the plurality of inner detectors and a part of the plurality of merged-probe openings, and a second isolator surrounding the other part of the plurality of inner detectors and the other part of the plurality of merged-probe openings.

17. A probe card test apparatus, comprising:

an insulating substrate;

a conductive pattern on the insulating substrate; and a plurality of device under test (DUT) units on the conductive pattern, wherein each of the DUT units includes a merged-probe opening, a probe opening, and a detector in parallel, and an isolator groove surrounding the merged-probe opening and the detector.

18. The probe card test apparatus as claimed in claim 17, wherein a position of the merged-probe opening corresponds to a position of a merged probe of a probe card.

19. The probe card test apparatus as claimed in claim 17, wherein:

the detector detects a merged-probe defect of a probe card through a direct current (DC) signal; and the detector detects a probe defect of the probe card through an alternating current (AC) signal.

20. The probe card test apparatus as claimed in claim 17, wherein:

one portion of the insulating substrate is exposed through the merged-probe opening; and another portion of the insulating substrate is exposed through the probe opening.

* * * * *